(12) United States Patent
Doyle et al.

(10) Patent No.: US 7,987,781 B2
(45) Date of Patent: Aug. 2, 2011

(54) METHOD AND APPARATUS FOR APPLYING AN ACCURATE PRINT PRESSURE DURING PRODUCTION

(75) Inventors: Dennis G. Doyle, Shrewsbury, MA (US); Ronald J. Forget, Douglas, MA (US)

(73) Assignee: Illinois Tool Works, Inc., Glenview, IL (US)

( * ) Notice: Subject to any disclaimer, the term of this patent is extended or adjusted under 35 U.S.C. 154(b) by 821 days.

(21) Appl. No.: 12/031,019

(22) Filed: Feb. 14, 2008

(65) Prior Publication Data
US 2009/0205518 A1  Aug. 20, 2009

(51) Int. Cl.
*B05C 17/04* (2006.01)
(52) U.S. Cl. ................. 101/123; 101/124; 101/126
(58) Field of Classification Search ........... 101/123, 101/124, 126, 129
See application file for complete search history.

(56) References Cited

U.S. PATENT DOCUMENTS

| | | | |
|---|---|---|---|
| 3,998,157 A | 12/1976 | Mitter | |
| 5,078,063 A | 1/1992 | Johansen et al. | |
| 5,388,508 A * | 2/1995 | Dubuit | 101/123 |
| 5,440,980 A | 8/1995 | Murakami et al. | |
| 5,479,854 A | 1/1996 | Chikahisa et al. | |
| 5,988,856 A * | 11/1999 | Braunstein et al. | 700/160 |
| 5,996,487 A | 12/1999 | Tomomatsu et al. | |
| 6,092,463 A * | 7/2000 | Onishi et al. | 101/129 |
| 6,105,495 A * | 8/2000 | Takahashi et al. | 101/123 |
| 6,112,656 A * | 9/2000 | Asai et al. | 101/123 |
| 6,324,973 B2 | 12/2001 | Rossmeisl et al. | |
| 6,397,741 B1 | 6/2002 | Curtin | |
| 6,619,198 B2 | 9/2003 | Rossmeisl et al. | |
| 6,626,097 B2 | 9/2003 | Rossmeisl et al. | |
| 6,955,120 B2 | 10/2005 | Pham-Van-Diep et al. | |
| 7,249,558 B2 | 7/2007 | Claiborne | |

FOREIGN PATENT DOCUMENTS
EP  0 937 577 A1  8/1999

OTHER PUBLICATIONS
International Search Report for PCT/US2009/030797 mailed Mar. 12, 2009.

\* cited by examiner

*Primary Examiner* — Ren Yan
(74) *Attorney, Agent, or Firm* — Lando & Anastasi, LLP

(57) ABSTRACT

A stencil printer includes a frame, a stencil coupled to the frame, a substrate support coupled to the frame to support a substrate in a print position, and a print head, coupled to the frame, to deposit and print viscous material over the stencil. The print head may include a squeegee blade configured to engage the stencil, a squeegee blade mount configured to house the squeegee blade, a squeegee blade movement mechanism configured to move the squeegee blade mount in a z-axis direction from a raised position in which the squeegee blade is spaced from stencil and a lowered position in which the squeegee blade engages and applies a force on the stencil, and a connector configured to pivotally connect the squeegee blade mount to the squeegee blade movement mechanism. The connector may include a load cell configured to measure force of the squeegee blade against the stencil. Other embodiments and related methods are further disclosed.

17 Claims, 7 Drawing Sheets

METHOD AND APPARATUS FOR APPLYING AN ACCURATE PRINT PRESSURE DURING PRODUCTION

BACKGROUND OF INVENTION

1. Field of Invention

The disclosure relates generally to methods and apparatus for printing viscous material, such as solder paste, onto a substrate, such as a printed circuit board, and more particularly to a method and apparatus for improving the accuracy of print pressure or force applied by squeegee blades of a print head on a stencil, and for applying an accurate print pressure during production.

2. Discussion of Related Art

In a typical surface-mount circuit board manufacturing operation, a stencil printer is used to print solder paste onto a printed circuit board. A circuit board, broadly referred to as an electronic substrate, having a pattern of pads or some other conductive surface onto which solder paste will be deposited, is automatically fed into the stencil printer. Small holes or marks on the circuit board, called fiducials, are used to align the circuit board with the stencil or screen of the stencil printer prior to the printing of solder paste onto the circuit board. The fiducials serve as reference points when aligning a circuit board with the stencil. Once a circuit board has been aligned with the stencil in the printer, the circuit board is raised to the stencil by a substrate support, e.g., a table having pins or other work holders, and fixed with respect to the stencil. Solder paste is then dispensed by moving a wiper blade or squeegee across the stencil to force the solder paste through apertures formed in the stencil and onto the circuit board. As the squeegee is moved across the stencil, the solder paste tends to roll in front of the blade, which desirably causes mixing and shearing of the solder paste to attain a desired viscosity to facilitate filling of the apertures in the screen or stencil. The solder paste is typically dispensed onto the stencil from a standard solder paste supply cartridge. After the print operation, the board is then released, lowered away from the stencil, and transported to another station within the printed circuit board fabrication line.

During a print cycle, as described above, the squeegee is moved across the stencil to force solder paste or any other viscous material through apertures formed in the stencil. FIG. 1 schematically illustrates a print head, generally indicated at 200, having a squeegee blade 202. In one embodiment, the squeegee blade 202 may be secured to a squeegee blade holder 204 in a position in which the squeegee blade may be disposed vertically or at an angle with respect to a stencil 206 to force solder paste through the apertures (not shown) of the stencil. In one embodiment, the print head 200 may include a first movable plate 208 and a second movable plate 210 that is connected to the first movable plate. The first movable plate 208 may be secured to a frame (not shown) of the print head 200 by two linear bearings, each indicated at 212. The first movable plate 208 may be configured to move up and down by means of a lead screw 214, which is driven by a motor (not shown) provided in the print head 200. The arrangement is such that the lead screw 214 threadably engages a lead nut 216 secured to the first movable plate 208 to move the first and second movable plates 208, 210 along a path defined by the linear bearings 212. As shown, the second movable plate 210 may be connected to the blade holder 204. In a certain embodiment, a compression spring 218 may be disposed around the lead screw 214 to provide a resistance force between the first movable plate 208 and the second movable plate 210.

Accurate printing is dependent upon the print head 200 being able to apply a constant pressure on the stencil 206 during a print operation, which is often difficult to control. One cause of inconsistent pressure application is due to inadequate support of the circuit board. Specifically, the support tooling (e.g., pins or flexible tooling) may not adequately provide support to the circuit board during the performance of a print operation. Other causes of inconsistent pressure may be associated with variations associated with the spring constant of the compression spring 218 and unwanted friction created by the linear bearings 212, which either alone or together may make it difficult to determine whether a desired pressure or force is being accurately applied. Yet another cause is that the spring constant of the squeegee blade 202 may effect the force upon which the squeegee blade engages the stencil 206.

With reference to FIG. 1, a sensor 220 may be provided to a home position and/or a predetermined distance of the first movable plate 208 with respect to the frame of the print head 200. With the known calibration methods, e.g., replacing the squeegee blade 202 with a calibration gauge (not shown), the force of the squeegee blade against the stencil is determined by moving the first movable plate 208 a known distance, which is dependent upon the spring constant of the compression spring 218 and the friction of the linear bearings 212. Thus, if a completely rigid squeegee blade is utilized, the force of the squeegee blade 202 against the stencil 206 may be somewhat accurate, provided, however, that friction caused by the linear bearings 212 is minimal or predictable. It may be difficult to determine the force of the squeegee blade 202 against the stencil 206 when the squeegee blade is flexible, when the linear bearings 212 are not properly installed, or when the spring constant of the compression spring 218 is not to tolerance.

SUMMARY OF INVENTION

Embodiments of the disclosure provide improvements to stencil support assemblies, such as those described above.

One aspect of the disclosure is directed to a stencil printer for printing viscous material on a substrate. In one embodiment, the stencil printer comprises a frame, a stencil coupled to the frame, a substrate support coupled to the frame to support a substrate in a print position, and a print head, coupled to the frame, to deposit and print viscous material over the stencil. In a certain embodiment, the print head comprises a squeegee blade configured to engage the stencil, a squeegee blade mount configured to house the squeegee blade, a squeegee blade movement mechanism configured to move the squeegee blade mount in a z-axis direction from a raised position in which the squeegee blade is spaced from stencil and a lowered position in which the squeegee blade engages and applies a force on the stencil, and a connector configured to pivotally connect the squeegee blade mount to the squeegee blade movement mechanism. The connector may comprise a load cell configured to measure force of the squeegee blade against the stencil.

Embodiments of the stencil printer may be directed to the connector comprising a pivot plate pivotally connected to the squeegee blade mount, and a rear block pivotally connected to the pivot plate. The connector may further comprise a load cell mounting block configured to house the load cell. The load cell mounting block may be secured to the pivot plate and the rear block. The pivot plate may include a first pivot shaft and a pivot bearing housed within the squeegee blade mount. The pivot bearing may be configured to receive the first pivot shaft therein. The pivot plate may further include a second pivot shaft and two angular contact bearings housed within the rear block. The two angular contact bearings may be configured to receive the second pivot shaft therein. The squeegee blade movement mechanism may comprise a housing, a lead screw threadably coupled to the housing, and at least one compression spring disposed around the lead screw to provide a resistance force between the housing and the lead screw. A controller may be provided to control the operation of the stencil printer. The controller may be configured to communicate with the load cell. A display may be coupled to the controller and configured to display force readings obtained by the load cell.

Another aspect of the disclosure is directed to a stencil printer comprising a frame, a stencil coupled to the frame, and a print head, coupled to the frame, to deposit and print viscous material over the stencil. In one embodiment, the print head may comprise a squeegee blade assembly configured to move viscous material across the stencil, a squeegee blade movement mechanism configured to move the squeegee blade assembly in a z-axis direction from a raised position in which the squeegee blade assembly is spaced from stencil and a lowered position in which the squeegee blade assembly engages and applies a force on the stencil, and a pivot plate pivotally connected to the squeegee blade assembly and pivotally connected to the squeegee blade movement mechanism.

Embodiments of the stencil printer may be directed to the provision of the connector comprising a load cell configured to measure force of the squeegee blade against the stencil. The connector may further comprise a load cell mounting block configured to house the load cell. The load cell mounting block may be secured to the pivot plate and the rear block. The pivot plate may include a first pivot shaft and a pivot bearing housed within the squeegee blade mount. The pivot bearing may be configured to receive the first pivot shaft therein. The pivot plate may further include a second pivot shaft and two angular contact bearings housed within the rear block. The two angular contact bearings may be configured to receive the second pivot shaft therein. The squeegee blade movement mechanism may comprise a housing, a lead screw threadably coupled to the housing, and at least one compression spring disposed around the lead screw to provide a resistance force between the housing and the lead screw. The stencil printer may comprise a controller to control the operation of the stencil printer. The controller may be configured to communicate with the load cell. The stencil printer may further comprise a display coupled to the controller and configured to display force readings obtained by the load cell.

Yet another aspect of the disclosure is directed to a method of attaching a squeegee blade assembly to a squeegee movement mechanism. The squeegee blade assembly may include a squeegee blade mount and a squeegee blade, with the stencil movement mechanism having a drive and a housing coupled to the drive. The method may comprise securing squeegee blade mount to a pivot plate, securing the pivot plate to a connector assembly having a load cell with a pivot shaft, and securing the pivot plate to the housing with a fastener.

Embodiments of the method may include configuring the connector assembly to have an upper load cell mounting block secured to an upper portion of the load cell and a lower load cell mounting block secured to a lower portion of the load cell. The method may also comprise disposing a pivot bearing in the squeegee blade mount, with the pivot bearing being configured to receive the pivot shaft therein.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
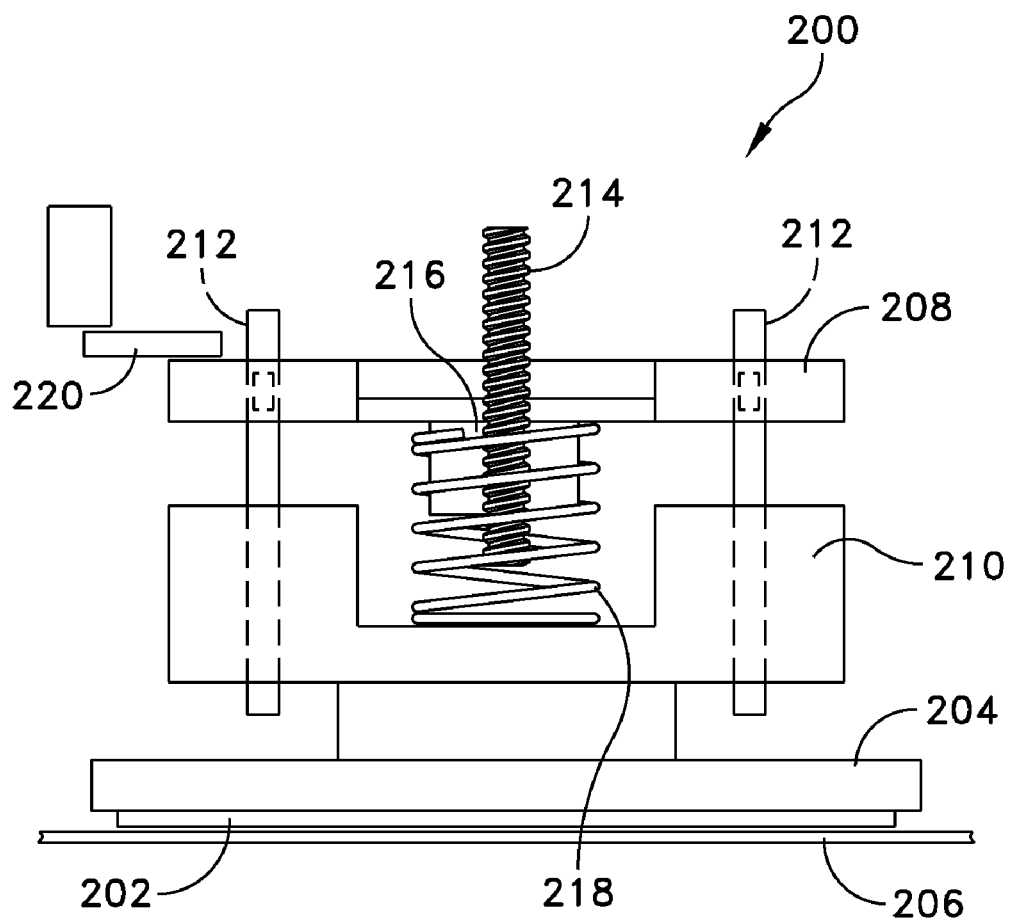
FIG. 1 is a schematic view of a prior art print head assembly.

This disclosure is not limited in its application to the details of construction and the arrangement of components set forth in the following description or illustrated in the drawings. The disclosure is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

For purposes of illustration, embodiments of the disclosure will now be described with reference to a stencil printer used to print solder paste onto a printed circuit board. One skilled in the art will appreciate, however, that embodiments of the disclosure are not limited to stencil printers for printing solder paste, but may also include printing other materials, such as adhesives, epoxies, underfill materials and encapsulant materials. Also, the terms "screen" and "stencil" may be used interchangeably herein to describe a device in a printer that defines a pattern to be printed onto a substrate. In addition, the terms "force" and "pressure" may be used interchangeably herein to describe the engagement of a squeegee blade against the stencil.

Figure 2:
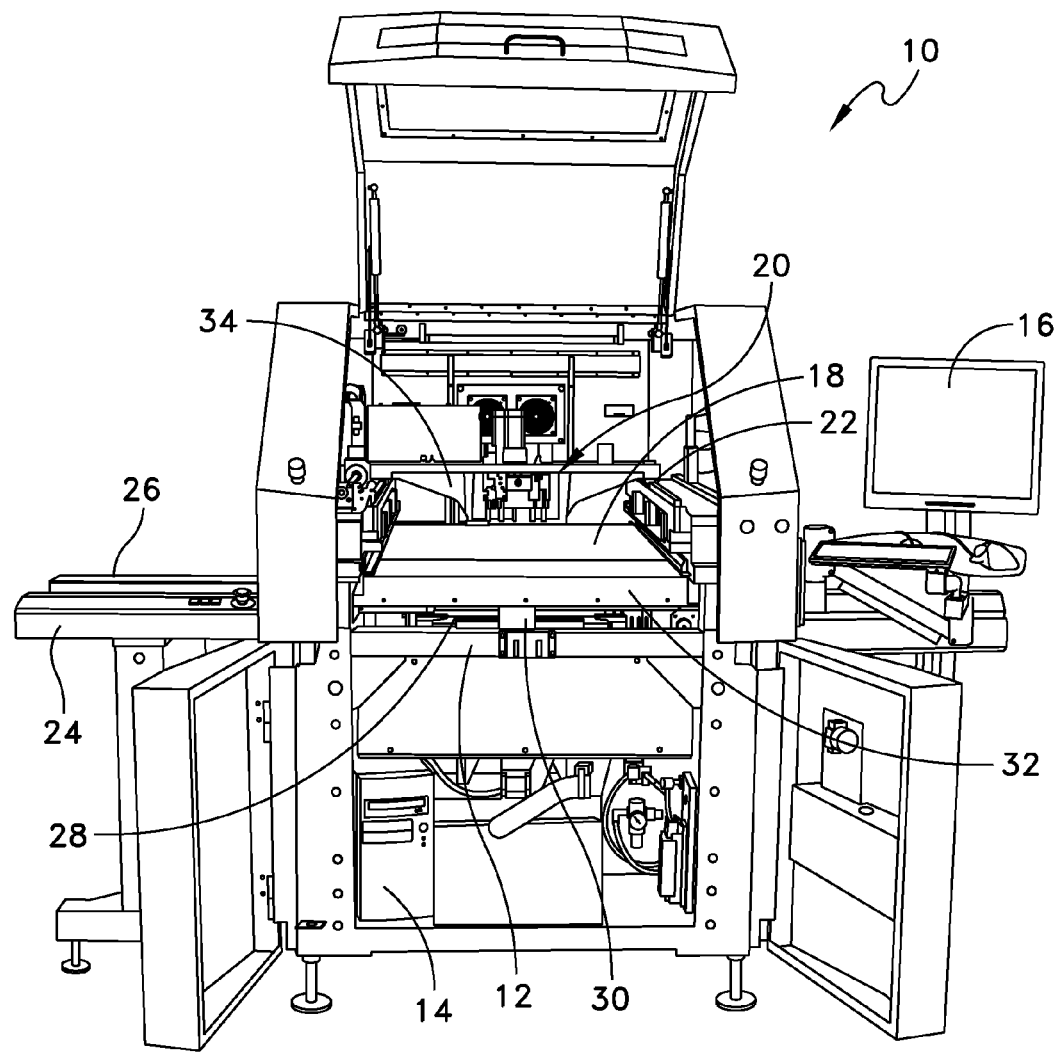
FIG. 2 is a front perspective view showing a stencil printer of an embodiment of the disclosure.

Referring now to the drawings, and more particularly to FIG. 2, there is generally indicated at 10 a stencil printer of an embodiment of the disclosure. As shown, the stencil printer 10 includes a frame 12 that supports components of the stencil printer. The components of the stencil printer may include, in part, a controller 14, a display 16, a stencil 18, and a print head assembly or print head, generally indicated at 20, configured to apply the solder paste. As shown in FIG. 1 and described below, the stencil and the print head may be suitably coupled or otherwise connected to the frame 12. In one embodiment, the print head 20 may be mounted on a print head gantry 22, which may be mounted on the frame 12. The gantry 22 enables the print head 20 to be moved in the y-axis direction under the control of the controller 14. As described below in further detail, the print head 20 may be placed over the stencil 18 and a front or a rear squeegee blade of the print head may be lowered in the z-axis direction into contact with the stencil. The squeegee blade of the print head 20 then may be moved by means of the gantry 22 across the stencil 18 to allow printing of solder paste onto a circuit board.

Stencil printer 10 may also include a conveyor system having rails 24, 26 for transporting a printed circuit board (sometimes referred to as a "printed wiring board," "substrate" or "electronic substrate") to a print position in the stencil printer. The rails 24, 26 may be referred to herein as a "tractor feed mechanism," which is configured to feed, load or otherwise deliver circuit boards to the working area of the stencil printer, which may be referred to herein as the "print nest," and to unload circuit boards from the print nest. The stencil printer 10 has a support assembly 28 to support the circuit board, which raises and secures the circuit board so that it is stable during a print operation. In certain embodiments, the substrate support assembly 28 may further include a particular substrate support system, e.g., a solid support, a plurality of pins or flexible tooling, which is positioned beneath the circuit board when the circuit board is in the print position. The substrate support system may be used, in part, to support the interior regions of the circuit board to prevent flexing or warping of the circuit board during the print operation.

In one embodiment, the print head 20 may be configured to receive solder from a source, such as a dispenser, e.g., a solder paste cartridge, that provides solder paste to the print head during the print operation. Other methods of supplying solder paste may be employed in place of the cartridge. For example, solder paste may be manually deposited between the squeegee blades or from an external source. Additionally, in a certain embodiment, the controller 14 may be configured to use a personal computer having a Microsoft DOS or Windows XP operating system with application specific software to control the operation of the stencil printer 10. The controller 14 may be networked with a master controller that is used to control a production line for fabricating circuit boards.

In one configuration, the stencil printer 10 operates as follows. A circuit board is loaded into the stencil printer 10 using the conveyor rails 24, 26. The support assembly 28 raises and secures the circuit board to a print position. The print head 20 then lowers the desired squeegee blade of the print head in the z-axis direction until squeegee blade of the print head contacts the stencil 18 at a desired pressure. The print head 20 is then moved in the y-axis direction across the stencil 18 by the print head gantry 22. The print head 20 deposits solder paste through apertures in the stencil 18 and onto the circuit board. Once the print head has fully traversed the stencil 18 across the apertures, the squeegee blade is lifted off the stencil and the circuit board is lowered back onto the conveyor rails 24, 26. The circuit board is released and transported from the stencil printer 10 so that a second circuit board may be loaded into the stencil printer. To print on the second circuit board, the other squeegee blade is lowered in the z-axis direction into contact with the stencil and the print head 20 is moved across the stencil 18 in the direction opposite to that used for the first circuit board.

Still referring to FIG. 2, an imaging system 30 may be provided for the purposes of aligning the stencil 18 with the circuit board prior to printing and to inspect the circuit board after printing. In one embodiment, the imaging system 30 may be disposed between the stencil 18 and the support assembly 28 upon which a circuit board is supported. The imaging system 30 is coupled to an imaging gantry 32 to move the imaging system. In one embodiment, the imaging gantry 32 may be coupled to the frame 12, and includes a beam that extends between side rails of the frame 12 to provide back and forth movement of the imaging system 30 over the circuit board in a y-axis direction. The imaging gantry 32 further may include a carriage device, which houses the imaging system 30, and is configured to move along the length of the beam in an x-axis direction. The construction of the imaging gantry 32 used to move the imaging system 30 is well known in the art of solder paste printing. The arrangement is such that the imaging system 30 may be located at any position below the stencil 18 and above the circuit board to capture an image of predefined areas of the circuit board or the stencil, respectively. In other embodiments, when positioning the imaging system outside the print position the imaging system may be located above or below the stencil and the circuit board.

Exemplary platforms for performing print operations described herein may include and are not limited to the ACCELA® and MOMENTUM™ stencil printers offered by Speedline Technologies, Inc. of Franklin, Mass., the assignee of the present disclosure.

In one embodiment, the print head 20 includes a frame member 34 that forms part of the gantry 22. The frame member 34 is configured to move along the print direction, e.g., the y-axis direction. Specifically, the frame member 34 is configured at its opposite ends to ride along linear rails (not designated in FIG. 2) of the frame 12 of the stencil printer 10. This construction provides y-axis direction of movement of the print head gantry 22. In one embodiment, the frame member 34 supports a squeegee assembly having front and rear squeegee blades and movement mechanisms configured to move the squeegee blades independently. Under the control of its respective movement mechanism, each squeegee blade is configured to move along a z-axis direction from a raised position in which the squeegee blade is spaced from the stencil to a lowered position in which the squeegee blade engages and applies pressure against the stencil.

Figure 3:
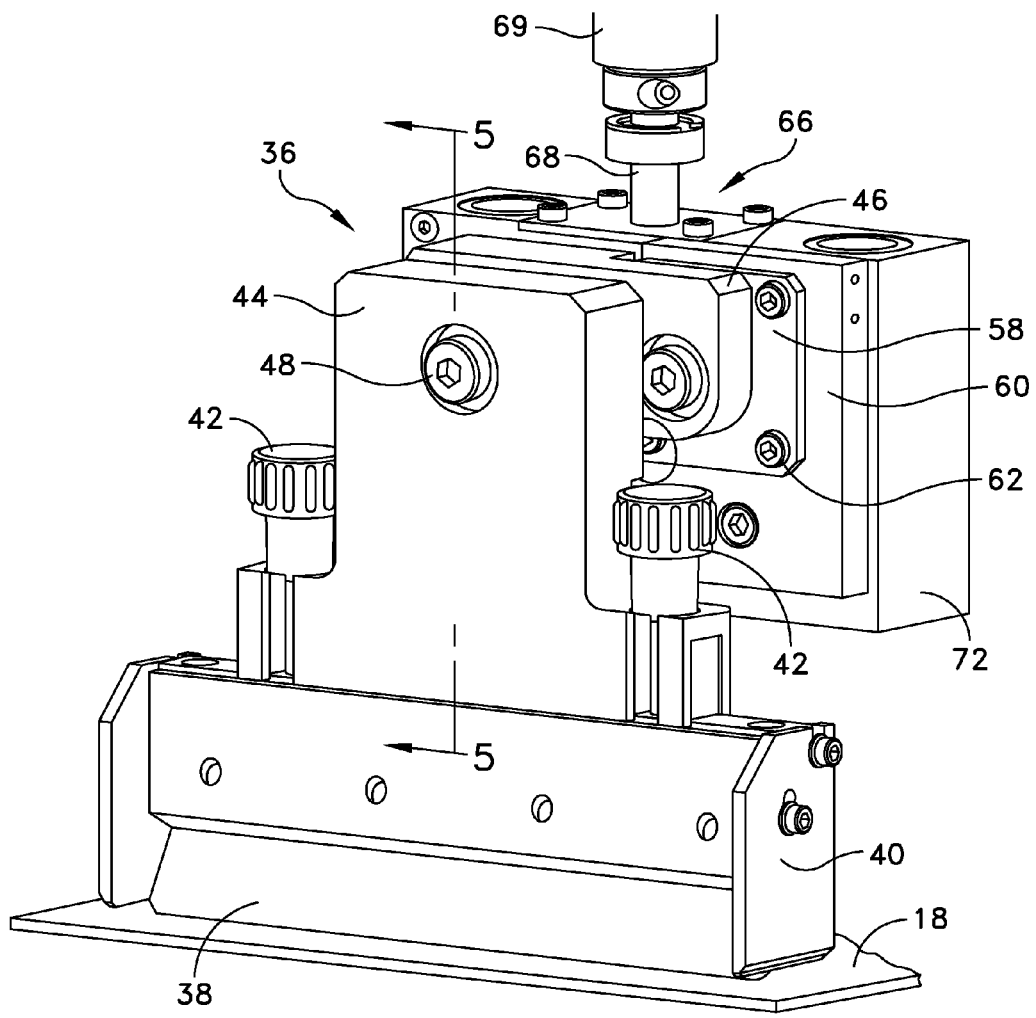
FIG. 3 is a perspective view of the stencil printer shown in FIG. 2 showing a print head assembly of an embodiment of the disclosure.

FIG. 3 illustrates a single squeegee assembly, generally indicated at 36, having a squeegee blade 38, e.g., the front squeegee blade, with the rear squeegee blade assembly being removed for illustration purposes. The squeegee assembly 36 is constructed to include a squeegee blade holder 40 configured to releasably secure the squeegee blade 38 by means of two thumb screws, each indicated at 42. As shown, the squeegee assembly 36 further includes a front mount 44 to mount the front squeegee blade holder 40. As will be described below, the front mount 44 is coupled in the manner described below to a motor of the movement mechanism, which is configured to move the mount along the z-axis. Although not shown, the rear squeegee blade assembly also includes a rear mount to mount the rear squeegee blade. The arrangement is such that the front squeegee blade 38 may be independently lowered in the z-axis direction by the motor prior to performing a print stroke with the front squeegee blade. The squeegee assembly 36 may further include the sensor (not shown) similar to the sensor 220 shown in FIG. 1 for detecting a home (i.e., raised) location of the squeegee blade 38.

When the front squeegee blade 38 is lowered onto the stencil 18, the squeegee blade exerts a force on the stencil. Specifically, a z-axis force is applied to the stencil 18 as well as a y-axis force once the print head 20 begins its y-axis movement. These forces are sufficient to roll the solder paste and to force the solder paste through apertures formed in the stencil 18. The force of the squeegee blade 38 on the stencil 16 must be sufficient to force solder paste (or any other viscous material) through the apertures formed in the stencil, but not too great to damage the stencil. The solder paste is deposited on the circuit board after performing the print stroke with the print head 20. The solder paste deposits are extracted from the stencil 18 when separating the stencil 18 from the circuit board by lowering the support assembly. In alternate embodiments, the stencil 18 may be raised away from the circuit board to separate the stencil from the circuit board.

Figure 4:
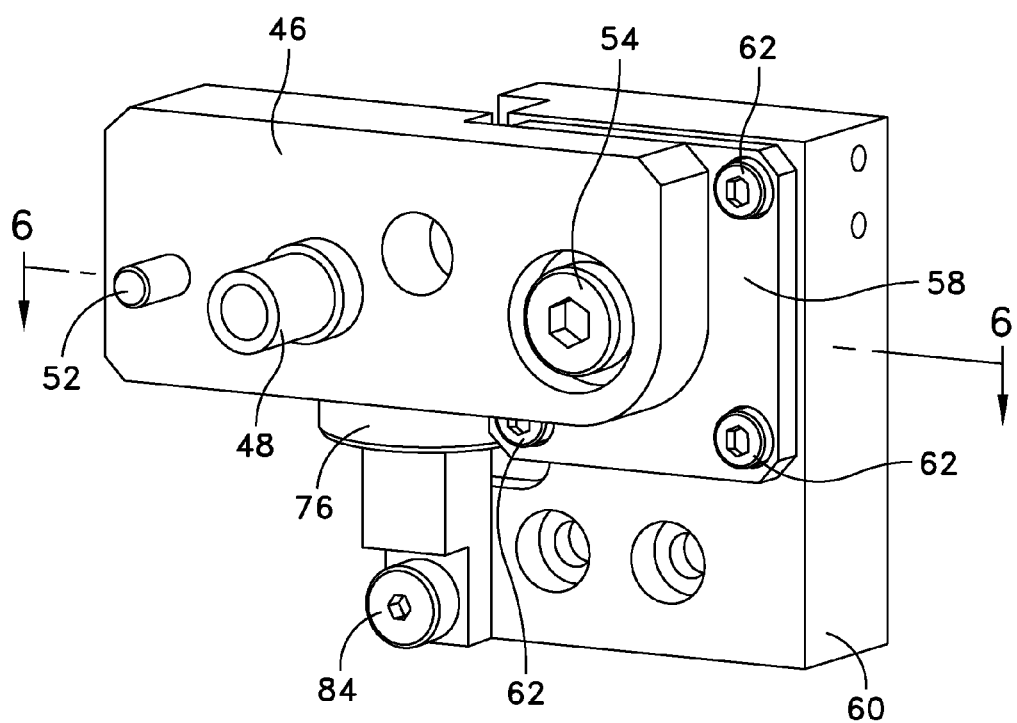
FIG. 4 is a perspective view of the print head assembly shown in FIG. 2 with a rear squeegee blade being removed to show movable members of the print head assembly more clearly.
Figure 5:
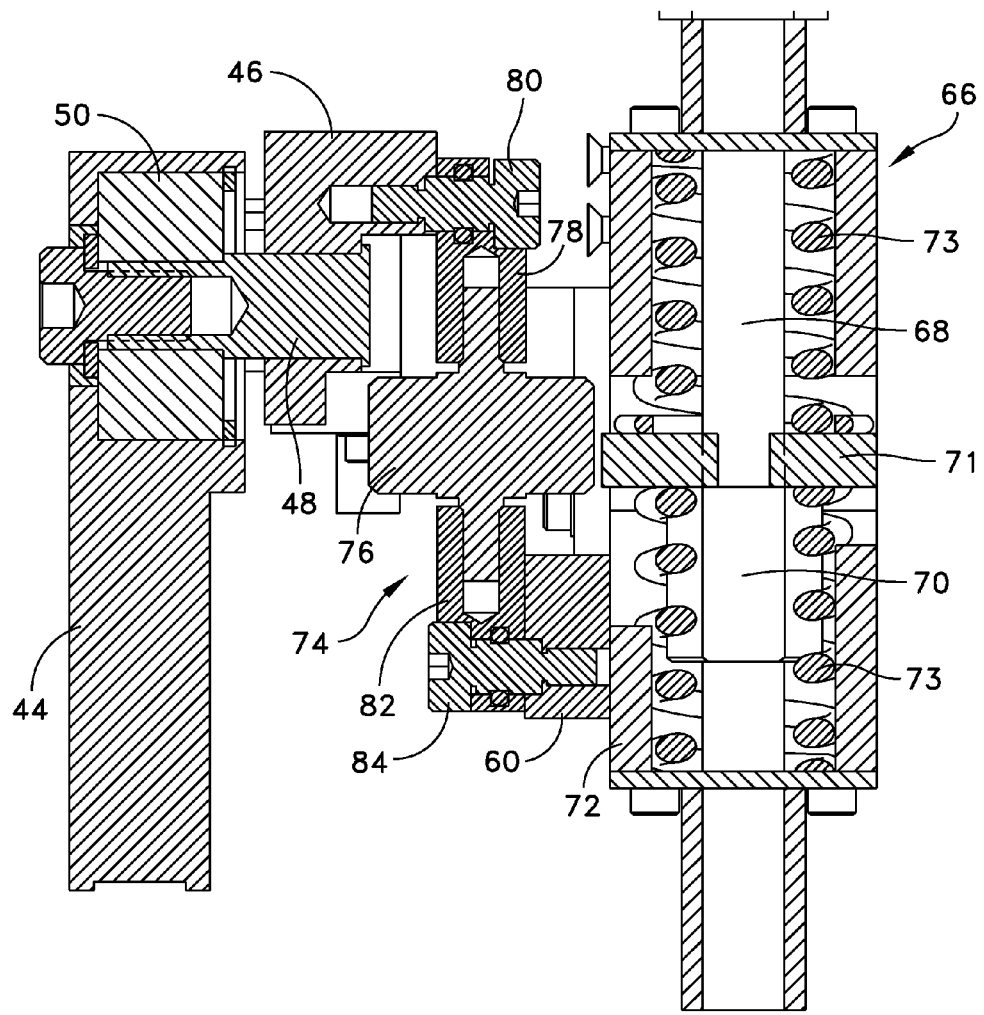
FIG. 5 is a cross-sectional view of the print head assembly shown in FIG. 3.
Figure 6:
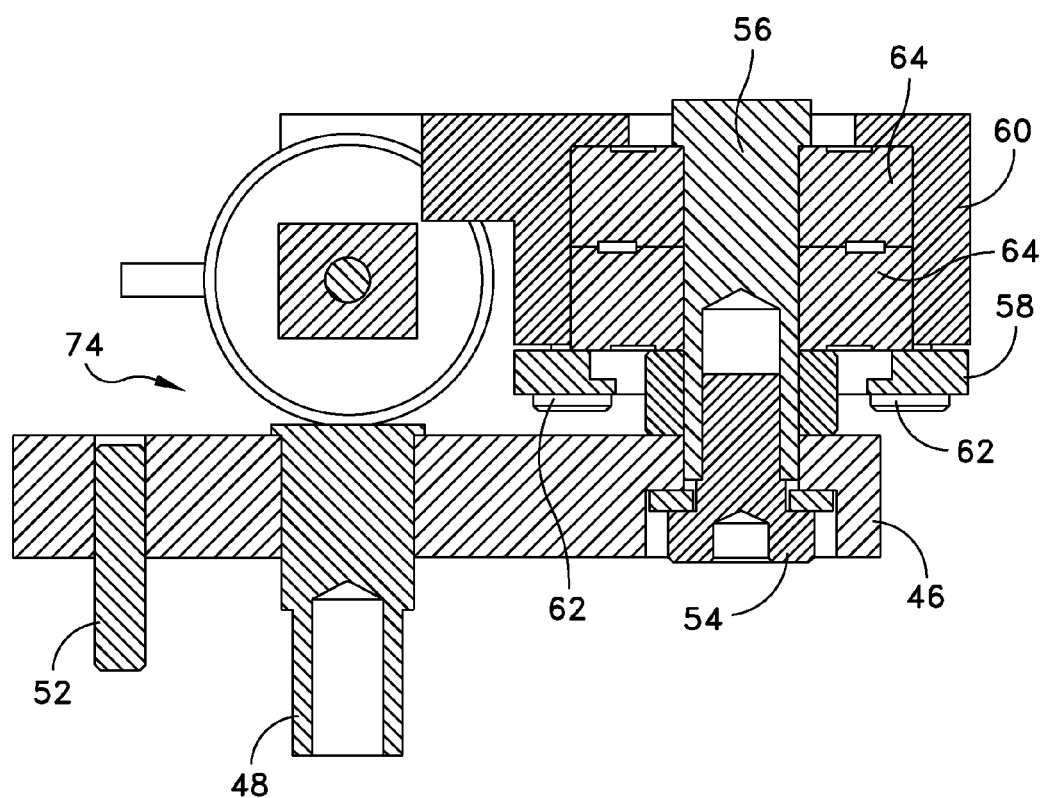
FIG. 6 is a cross-sectional view of the print head assembly shown in FIG. 4.

With continued reference to FIG. 3, and additional reference to FIGS. 4-6, in a certain embodiment, the front squeegee mount 44 is pivotally connected to a pivot plate 46 by a pivot shaft 48. As shown in FIG. 5, the pivot shaft 48 is rotatably fixed with respect to the pivot plate 46. The arrangement is such that the front squeegee mount 44 is capable of pivoting about the pivot shaft 48, with a pivot bearing 50 being provided to rotatably secure the pivot shaft 48 to the front squeegee mount as shown in FIG. 5. The pivot plate 46 includes on its left-hand side as viewed in FIG. 4 a limit pin 52 that travels within a groove (not shown) formed in the back side of the front squeegee mount 44 to limit the amount of pivot movement of the front squeegee mount with respect to the pivot plate 46. The pivot plate 46 further includes on its right-hand side as viewed in FIGS. 4 and 6 a fastener 54, e.g., a machine screw fastener, designed to secure the pivot plate to a pivot shaft 56, which extends through a clamp plate 58 and a rear block 60. As shown, the clamp plate 58 is secured to the rear block 60 by four fasteners, each indicated at 62. The rear block 60 is suitably coupled in the manner described below to the squeegee blade movement mechanism. A pair of angular contact bearings, each indicated at 64, are housed within the rear block 60 and enable the rotation of the pivot shaft 56 with respect to the rear block and the clamp plate. It should be understood that another type of bearing (other than angular contact bearings) may be used in the rear block 60 to enable the rotation of the pivot shaft 56.

Referring particularly to FIG. 5, the squeegee blade movement mechanism is generally indicated at 66. As described above, the squeegee blade movement mechanism 66 is configured to move the front squeegee blade assembly 36 from a raised position in which the squeegee blade is spaced from stencil 18 and a lowered position in which the squeegee blade engages the stencil. Although not shown, there is another squeegee blade movement mechanism to drive the movement of the rear squeegee blade between its raised and lowered positions. In one embodiment, the squeegee blade movement mechanism 66 comprises a lead screw 68, which is rotatably driven by a motor, which is represented by motor shaft 69 in FIG. 3. The lead screw 68 threadably engages a nut 70, which is secured to a housing 72 to move the housing between a raised and a lowered position. An anti-rotation plate 71 may be provided to prevent the rotation of the assembly when driving the lead screw. A pair of compression springs, each indicated at 73, are disposed around the lead screw 68 to provide a resistance force between the housing 72 and the lead screw. As shown, one compression spring 73 is disposed above the anti-rotation plate 71 and another compression spring is disposed below the anti-rotation plate. The arrangement is such that the motor 69 drives the lead screw 68 in one direction to move the housing 72 in a downward direction, which results in the movement of the front squeegee blade 38 in the downward direction. As soon as the squeegee blade 38 contacts the stencil 18, the top compression spring 73 begins to compress to provide a resistance force while the bottom compression spring 73 begins to decompress. The force or pressure applied by the squeegee blade 38 against the stencil 18 may be increased or decreased by controlling the direction of rotation of the motor shaft 69. Thus, the motor is also configured to drive the movement of the squeegee blade in an upward direction by rotating the lead screw 68 in an opposite direction.

Referring particularly to FIGS. 5 and 6, the pivot plate 46 is further secured to the squeegee blade movement mechanism 66 by a connector assembly, which is generally indicated at 74. The connector assembly 74 includes a load cell 76, an upper load cell mounting block 78 configured to be secured to the pivot plate 46 by a fastener 80, and a lower load cell mounting block 82 configured to be attached to the rear block 60 by a fastener 84 (FIG. 4). As best shown in FIG. 5, an upper portion of the load cell 76 is threadably secured to the upper load cell mounting block 78 and a lower portion of the load cell is threadably secured to the lower load cell mounting block 82. In one embodiment, the load cell 76 may include a transducer that is used to convert a force into an electrical signal that is transmitted to the controller 14. Specifically, a signal from the load cell 76 is amplified (e.g., by an amplifier) and sent to a drive module of the controller for controlling the movement of the squeegee blade in the z-axis direction.

For example, the load cell 76 may be of the type provided under the brand name Sensotec by Honeywell of Columbus, Ohio or by Delta Metrics, Inc. of Worthington, Ohio. The controller 14 may be configured to display the force on the display 16. Other types of load cells known in the art may be also utilized. Notwithstanding the particular embodiment, the load cell 76 is configured to measure and transmit the amount of force (or pressure) being applied by the squeegee blade 38 (e.g., the front squeegee blade) on the stencil 18.

The arrangement is such that when moving squeegee blade 38 to engage the stencil, the movement mechanism 66 causes downward movement of the front mount 44 via the connector assembly 74. The force of the squeegee blade 38 against the stencil 18 is measured by the load cell 76, which is disposed between the pivot shaft 48 and the rear block 60. Thus, a desired force of the squeegee blade 38 against the stencil 18 may be accurately selected by the operator of the stencil printer 10.

Thus, the squeegee assembly 38 is mounted on the pivot plate 46 by a rotational bearing 50, which is positioned between the load and the load sensing device (e.g., load cell 76). This arrangement is designed to minimize friction and produces the greatest accuracy and responsiveness at the least cost. Load forces are transferred directly to the load-bearing components with little or no friction that effects the readings taken by the load cell.

Figure 7:
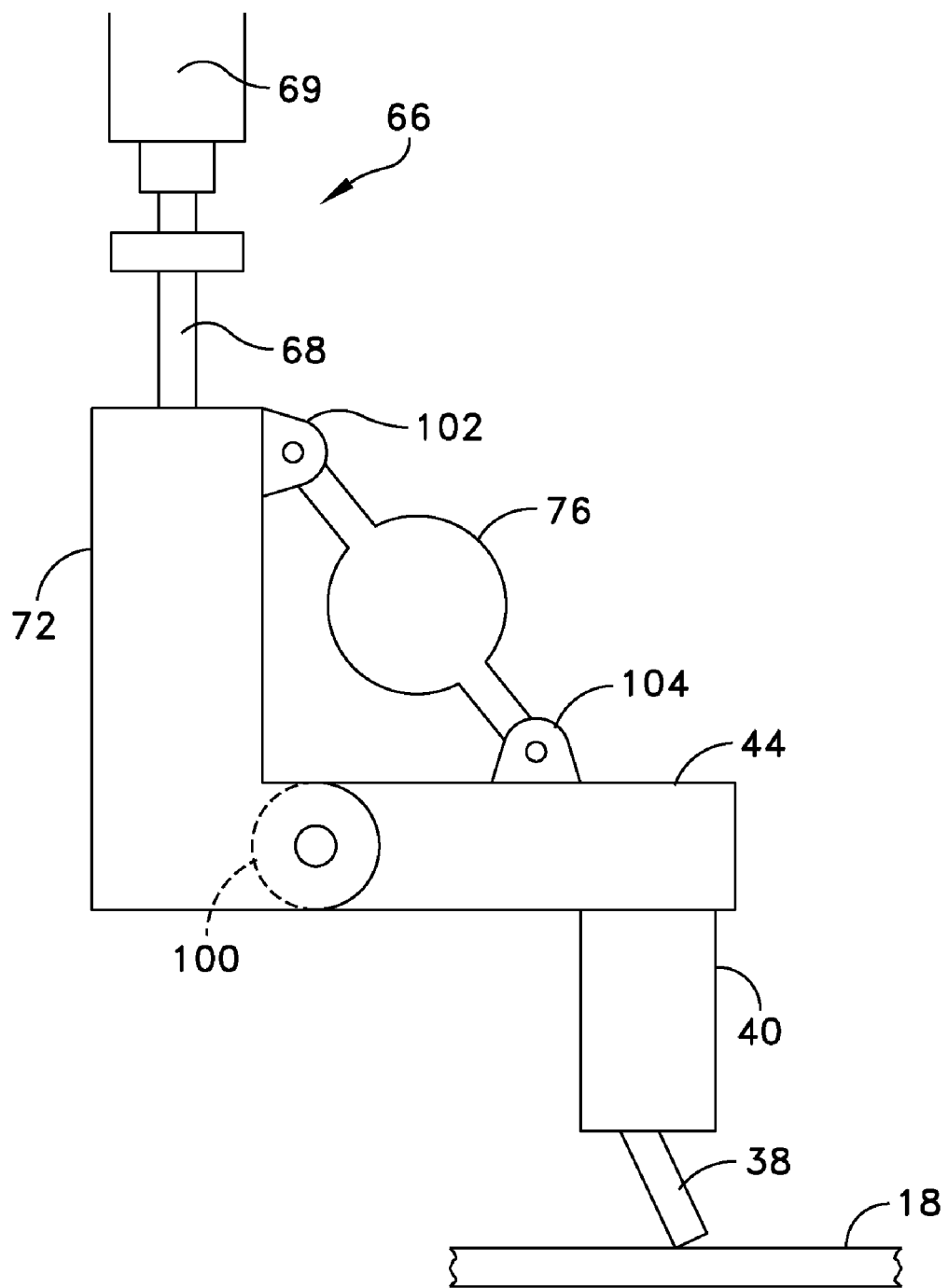
FIG. 7 is a schematic view of a connector of another embodiment.

FIG. 7 illustrates a connector assembly of another embodiment that incorporates a hinge mechanism to connect the squeegee movement mechanism to the squeegee blade assembly. As shown, a squeegee blade 38 is secured to holder 40, which in turn is secured to the squeegee mount 44. The squeegee mount 44 is hingedly mounted by means of a suitable bearing 100 to the housing 72. As with the embodiment shown in FIGS. 3-6, the movement mechanism 66 includes a lead screw 68 that is rotatably driven by motor shaft 69 to move the squeegee blade 38 up and down with respect to the stencil 18. As shown, the load 76 is pivotally connected at one end to the housing 72 by connector 102 and pivotally connected at its other end to the squeegee mount 44 by connector 104. This construction enables the load cell 76 to measure the force of the squeegee blade 38 against the stencil 18 in the manner described above with reference to FIGS. 3-6.

In a certain embodiment, the calibration or determination of the particular forces of the squeegee blades against the stencil may be measured in accordance with the teachings disclosed in U.S. patent application Ser. No. 11/786,971, entitled METHOD AND APPARATUS FOR CALIBRATING PRINT HEAD PRESSURE AND APPLYING AN ACCURATE PRINT PRESSURE DURING PRODUCTION, filed on Apr. 13, 2007, which is owned by the assignee of the present disclosure and incorporated herein for all purposes. Although the teachings in this application are particularly directed to open loop printing and calibrating the print head of an open loop printer (when applying unpressurized solder paste), the teachings disclosed therein may be applicable with closed loop printing (when applying pressurized solder paste).

For example, to calibrate the force of the engagement of a particular squeegee blade (front squeegee blade 38 or rear squeegee blade) against the stencil 18 in open loop printing, a first step of a calibration routine is to replace the squeegee blade with a force/calibration gauge, which is provided to measure the force of a squeegee blade against the stencil by moving the gauge to the lowered position. In addition, the stencil is removed from the stencil printer. The gauge is lowered by the squeegee blade movement mechanism until the gauge touches a rigid surface, such as a table or tooling top. The squeegee blade movement mechanism continues to lower the gauge in known increments. At each known increment, the gauge records the force value, which is saved by the controller within a processor configured to have squeegee force calibration routine, for example. An example of recorded values is as follows:

| Steps of Motion | Force |
|---|---|
| 0 | 0 |
| 1000 | 1 lb |
| 2000 | 2 lbs |
| 3000 | 3 lbs |
| 50,000 | 50 lbs |

Next, the squeegee blade holder is returned to the raised or starting position (at 0 steps of motion). The gauge is lowered until an edge of a flag, which corresponds to a first reference point, triggers a sensor. This force is recorded and stored within the controller. The gauge is further lowered until another edge of the flag, which corresponds to a second reference point, triggers the sensor. This force is recorded and stored within the controller. The result is that the recorded forces correspond to the level of compression of the compression spring, which is linear and repeatable.

Next, the operator removes the gauge and installs the squeegee blade (e.g., squeegee blade onto the blade holder. The squeegee blade is lowered until it touches the stencil to determine a zero reference point. The squeegee blade is further lowered until the edges of the flag are detected. These positions are compared to the first and second reference points determined above to calculate the curve for the printing force of the specific squeegee blade. In another embodiment, this two-step process may be combined into a single process. Specifically, the system may be configured to start at a zero position and drive down the known increments through known transition points. The force values for all increments and transition points are recorded for future reference.

In another embodiment, for example, in a closed loop calibration process, the calibration routine may be performed as described above, but by measuring the force of the gauge on the tooling top and/or stencil and comparing the gauge results with results taken from the load cell 76. Specifically, the gauge is placed on the squeegee mount in place of the squeegee blade and by driving the squeegee assembly downward to through several specific locations. The readings of the gauge are transmitted to software of the controller 14 and charted against the readings taken from the load cell 76. The controller of the stencil printer utilizes this information to determine whether the print head is applying proper print forces.

In other embodiments, the load cell may be replaced by a large spring and a measuring device, such as a linear variable displacement transducer or LVDT. An advantage to using a load cell is that when the load cell experiences force within a predetermined range, the load cell does not move or change length, thereby preserving the spatial relationships of the other components of the system. However, similar results may be achieved by employing a large spring that experiences minimal movement over the force range, and a measuring device that measures the applied forces.

Thus, it should be observed that the squeegee mounting assemblies disclosed herein are lower in cost and more accurate and responsive than prior art squeegee mounting assemblies. One advantage is the provision of the rotary bearing system disposed between the load (i.e., the force applied by the squeegee blade on the stencil) and the load cell. Another advantage is the provision of squeegee mounting assemblies that are easy to assemble and operate.

The squeegee mounting assemblies disclosed herein are particularly suited for closed loop squeegee systems, which apply pressurized solder paste against the stencil during a print operation.

Having thus described several aspects of at least one embodiment of the disclosure, it is to be appreciated various alterations, modifications, and improvements will readily occur to those skilled in the art. Such alterations, modifications, and improvements are intended to be part of this disclosure, and are intended to be within the spirit and scope of the disclosure. For example, the parameters described herein may be modified to accommodate different printing process requirements. Accordingly, the foregoing description and drawings are by way of example only.

What is claimed is:

1. A stencil printer for printing viscous material on a substrate, the stencil printer comprising:
   a frame;
   a stencil coupled to the frame;
   a substrate support coupled to the frame to support a substrate in a print position; and
   a print head, coupled to the frame, to deposit and print viscous material over the stencil, the print head comprising
      a squeegee blade configured to engage the stencil,
      a squeegee blade mount configured to house the squeegee blade,
      a squeegee blade movement mechanism configured to move the squeegee blade mount in a z-axis direction from a raised position in which the squeegee blade is spaced from stencil and a lowered position in which the squeegee blade engages and applies a force on the stencil, and
      a connector assembly configured to pivotally connect the squeegee blade mount to the squeegee blade movement mechanism, the connector assembly comprising a pivot plate pivotally connected to the squeegee blade mount, a load cell coupled to the pivot plate and configured to measure force of the squeegee blade against the stencil, and a rear block disposed to connect the load cell to the squeegee blade movement mechanism.

2. The stencil printer of claim 1, wherein the connector further comprises a load cell mounting block configured to house the load cell, the load cell mounting block being secured to the pivot plate and the rear block.

3. The stencil printer of claim 1, wherein the pivot plate includes a first pivot shaft and a pivot bearing housed within the squeegee blade mount, the pivot bearing being configured to receive the first pivot shaft therein.

4. The stencil printer of claim 3, wherein the pivot plate includes a second pivot shaft and two angular contact bearings housed within the rear block, the two angular contact bearings being configured to receive the second pivot shaft therein.

5. The stencil printer of claim 1, wherein the squeegee blade movement mechanism comprises a housing, a lead screw threadably coupled to the housing, and at least one compression spring disposed around the lead screw to provide a resistance force between the housing and the lead screw.

6. The stencil printer of claim 1, further comprising a controller to control the operation of the stencil printer, the controller being configured to communicate with the load cell.

7. The stencil printer of claim 6, further comprising a display coupled to the controller and configured to display force readings obtained by the load cell.

8. A stencil printer for printing viscous material on a substrate, the stencil printer comprising:
   a frame;
   a stencil coupled to the frame; and
   a print head, coupled to the frame, to deposit and print viscous material over the stencil, the print head comprising
      a squeegee blade assembly configured to move viscous material across the stencil, and
      a squeegee blade movement mechanism configured to move the squeegee blade assembly in a z-axis direction from a raised position in which the squeegee blade assembly is spaced from stencil and a lowered position in which the squeegee blade assembly engages and applies a force on the stencil,
      wherein the squeegee blade assembly is pivotally connected to the squeegee blade movement mechanism by a connector assembly configured to pivotally connect the squeegee blade assembly to the squeegee blade movement mechanism, the connector assembly comprising a pivot plate pivotally connected to the squeegee blade assembly, a load cell coupled to the pivot plate and configured to measure force of the squeegee blade assembly against the stencil, and a rear block disposed to connect the load cell to the squeegee blade movement mechanism.

9. The stencil printer of claim 8, wherein the print head further comprises a load cell mounting block configured to house the load cell, the load cell mounting block being secured to the pivot plate and a rear block, which is coupled to the squeegee blade movement mechanism.

10. The stencil printer of claim 8, further comprising a controller to control the operation of the stencil printer, the controller being configured to communicate with the load cell.

11. The stencil printer of claim 10, further comprising a display coupled to the controller and configured to display force readings obtained by the load cell.

12. The stencil printer of claim 8, wherein the pivot plate includes a first pivot shaft and a pivot bearing housed within the squeegee blade mount, the pivot bearing being configured to receive the first pivot shaft therein.

13. The stencil printer of claim 12, wherein the pivot plate includes a second pivot shaft and two angular contact bearings housed within the rear block, the two angular contact bearings being configured to receive the second pivot shaft therein.

14. A stencil printer for printing viscous material on a substrate, the stencil printer comprising:
   a frame;
   a stencil coupled to the frame;
   a substrate support coupled to the frame to support a substrate in a print position; and
   a print head, coupled to the frame, to deposit and print viscous material over the stencil, the print head comprising
      a squeegee blade configured to engage the stencil,
      a squeegee blade mount configured to house the squeegee blade,
      a squeegee blade movement mechanism configured to move the squeegee blade mount in a z-axis direction from a raised position in which the squeegee blade is spaced from stencil and a lowered position in which the squeegee blade engages and applies a force on the stencil, and
      a connector assembly configured to one of pivotally and hingedly connect the squeegee blade mount to the squeegee blade movement mechanism, the connector assembly comprising a pivot plate pivotally connected to the squeegee blade mount, a device coupled to the pivot plate and configured to measure force of the squeegee blade against the stencil, and a rear block disposed to connect the device to the squeegee blade movement mechanism.

15. The stencil printer of claim 14, wherein the pivot plate includes a first pivot shaft and a pivot bearing housed within the squeegee blade mount, the pivot bearing being configured to receive the first pivot shaft therein.

16. The stencil printer of claim 15, wherein the pivot plate includes a second pivot shaft and two angular contact bearings housed within the rear block, the two angular contact bearings being configured to receive the second pivot shaft therein.

17. The stencil printer of claim 14, wherein the squeegee blade movement mechanism comprises a housing, a lead screw threadably coupled to the housing, and at least one compression spring disposed around the lead screw to provide a resistance force between the housing and the lead screw.

* * * * *